April 12, 1966 B. D. GRINDLE 3,246,247

PULSE WIDTH TO D.C. CONVERTER

Filed Nov. 18, 1963

United States Patent Office 3,246,247
Patented Apr. 12, 1966

3,246,247

PULSE WIDTH TO D.C. CONVERTER

Blaine D. Grindle, Vestal, N.Y., assignor to General Electric Company, a corporation of New York Filed Nov. 18, 1963, Ser. No. 324,302
5 Claims. (Cl. 328—34)

This invention relates to a device for converting electrical information signals which are pulse width modulated into electrical signals which are D.-C. voltage modulated. It is useful in electronic analog computers and in similar data processing applications. It may also perform scale changing functions.

In data processing systems where information variables are represented by a train of pulses, each pulse being synchronized to start at the beginning of a system cycle and having a duration proportional to the variable value being represented during the cycle, it is frequently desirable to convert the pulse width signal to a proportionate D.-C. voltage form. Since the average voltage level during a cycle is proportional to the variable value represented, where the pulses are of constant amplitude, a way of converting to a D.-C. voltage signal is to filter the pulse train. However, filtering inherently introduces a time delay. This time delay, before the D.-C. signal is available for additional data processing or as the system output signal, is undesirable in that it places operating speed limitations on the data processing system as a whole or a part thereof.

Other problems which arise in filter type pulse width to D.-C. converters include impedance matching requirements, precision specifications on components, filter size and weight, and frequency dependence. The filtering characteristics required of a filter converter severely constrain its impedance characteristics, which can generally be neither particularly high or low. As a result, either the input impedance of the receiving apparatus must be properly matched or signal degradation occurs. Also, filters require electronic components of relatively high precision so that reliability and costs become critical factors. Furthermore, high precision places severe restrictions on integrated fabrication techniques. The filter converters are, of course, designed to operate with a specified system pulse or clock frequency. Variations of this frequency will vary the filter response and therefore the converter scale, and different systems generally require redesign of the filter converter in accordance with the clock frequency.

In practice, accurate filter converters require gates to insure constant pulse height so that the average pulse-time area is a true measure of the information variable. Also, to prevent any undesirable interactions between the filter converter and the driven load, particularly with component temperature variations, it is usually desirable to insert an isolating circuit, typically using an operational amplifier. Furthermore, while pulse width modulation systems are inherently data sampling systems (once each cycle) that usually must be considered as practically limited in the rate of change of input signals to which they can respond to 10 percent of the pulse repetition rate. A further reduction by another order of magnitude to one percent of the repetition rate at which the output signal can be expected to change must be made to insure proper operation of a filter converter without degrading attenuation and time delay or transport lag.

Accordingly, it is an object of the invention to provide a pulse width to D.-C. converter in which the output signal is made available within a single pulse cycle.

It is a further object to provide a pulse width to D.-C. converter which is basically independent of the pulse repetition rate.

It is another object of the invention to provide a pulse width to D.-C. converter which does not require precision components.

It is another object to provide a pulse width to D.-C. converter which generates output signals that are unaffected by the load impedance.

Briefly stated, in accordance with certain aspects of the invention, a dynamic pulse width to D.-C. converter is provided which obviates the problems associated with passive filter converters. Ouput signals are generated by a low impedance operational amplifier integrator. The integrator is adapted for incremental operation whereby its D.-C. voltage output is changed each pulse cycle in accordance with a comparison of the variable input pulse with a feedback pulse generated by modulating the output D.-C. voltage into pulse width form. Provision is made for deriving signals representing positive and negative errors from the pulse width signals which are actually time ratios (always positive), and this is performed accurately through switching operations. Accuracy is optimized by providing operation whereby the output voltage is varied only in accordance with differences between the pulse width modulated feedback of the output voltage during the previous pulse period and the input pulses, while incorporating substantial gain.

The invention, together with further objects and advantages thereof, may best be understood by referring to the following description taken in conjunction with the appended drawing in which like numerals indicate like parts and in which.

Figure 1:
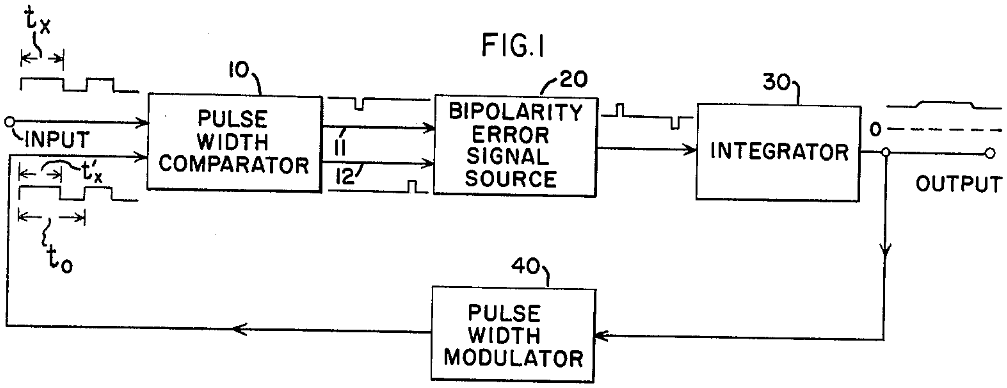
FIGURE 1 is a block diagram of a pulse width to D.-C. voltage converter.

Referring now to the drawing, FIGURE 1 is a block diagram of a preferred embodiment of the invention in which the input signal represents an input variable $x$ by its pulse duration $t_x$ being proportional to the information variable $x$. Dynamic conversion is produced by a closed loop system comprised of a pulse width comparator 10, a bipolarity error signal source 20, an integrator 30, and a pulse width modulator 40. Comparator 10 is responsive to the input pulse width modulated signals and feedback pulse width modulated signals to produce pulse width difference signals on one of two lines 11 or 12, the selection of which one indicating the polarity of the information. The lines 11 and 12 transmit signals respectively representing that the D.-C. output is too low or too high. These are pulse width modulated signals which are proportional to the difference in pulse durations. When the input signal $t_x$ is greater than the feedback signal $t'_x$, the error signal represents that the output signal $v_x$ is low, while no signal appears on line 12. The reverse conditions hold for $t'_x > t_x$. The pulse width comparator described in patent application Serial No. 315,230. "Pulse Width Comparator," filed October 10, 1963, by Ronald R. Raike and Hermann Schmid provides, with one output inverted, an excellent pulse width comparator.

Figure 2:
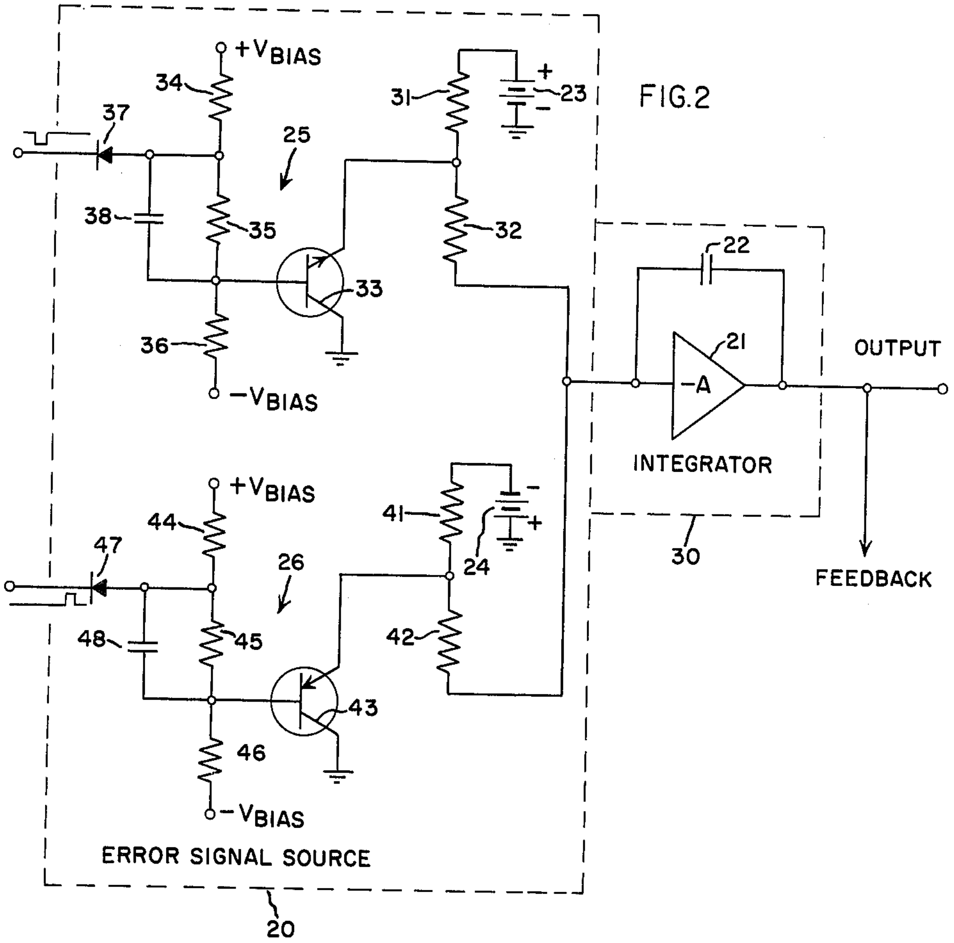
FIGURE 2 is a schematic diagram of portions of the FIGURE 1 converter.

The bipolarity error signal source 20 and integrator 30 of FIGURE 1 are shown in greater detail in FIGURE 2. To produce the pulse width to D.-C. converter output voltage $v_x$ from a low impedance source, the conventional analog integrator combination of a conventional operational amplifier 21 and the parallel integrating capacitor 22 are used. The input to the operational amplifier 21 is one of two opposite polarity reference voltage sources 23 and 24 which are gated by conventional switches such as solid state shunt switches 25 and 26, respectively, in accordance with respective error signals. Switches 25 and 26 connect the respective opposite polarity reference voltage sources 23 and 24 to the operational amplifier 21 for incremental integration proportional to the error signal durations.

The shunt switches 25 and 26, in response to the error signals, open normally closed shunt paths for the sources 23 and 24. Switching transistor 33, for example, is normally closed, providing a very low impedance path relative to resistor 32 so that substantially all of the reference voltage appears across resistor 31, and the voltage is negligible across resistor 32, the input to operational amplifier 21. However, when the switching transistor 33 is turned OFF, the shunt path is effectively disconnected by the transistor 33 switching to its relatively high impedance state, whereby the reference signal is applied to operational amplifier 21 for integration.

The switching transistor 33 is normally biased ON by the bias sources $+v_{BIAS}$ and $-v_{BIAS}$ and the voltage dividing resistors 34, 35 and 36, where the resistance 36 is larger than that of resistors 34 and 35 together, so that the base of transistor 33 is positive relative to the ground on the collector. The positive error pulse, applied through isolating diode 37 to the junction of resistors 34 and 35, removes this bias whereby the transistor 25 is turned OFF. The capacitor 38 provides a direct parallel connection to the base of transistor 33 to produce faster switching by an initially low impedance path and an assisting transistor turn-off current source at termination.

The shunt switch 26 opeartes in the same manner as switch 25 with transistor 43, resistors 41 and 42, voltage dividing resistors 44–46, isolating diode 47 and coupling capacitor 48 performing the same functions as the corresponding components in switch 25. Because of the difference in voltage polarities being switched, opposite type (npn and pnp) transistors 33 and 43 are used.

The D.-C. to pulse width modulator 40 determines the basic accuracy of the pulse with to D.-C. converter. This results because the output voltage $v_x$ will be maintained at whatever level is dictated by the modulater 40, by means of the comparison of feedback $t'_x$ with input $t_x$. The modulator will normally be of the same kind as that used throughout the particular data processing system at the input interfaces, etc., and will accordingly produce compatible accuracy for the invention. For example, pulse, width modulator 40 may be of the type described in patent application Serial No. 324,263, filed concurrently herewith, "Pulse Width Modulator" by Blaine Grindle and Hermann Schmid, or patent application, Serial No. 198,889, filed May 31, 1962, "Hybrid Digital-Analog Circuit" by Walter R. Seegmiller.

While the pulse width comparator 10 provides the required switching signals in a particularly useful form, it is not an essential component. The input signal, having pulses of width $t_x$, can be applied directly to switch 26, and the inverted feedback signal, having pulses of width $t'_x$, can be applied directly to switch 25. The integrator 30 is then responsive to the difference of the currents generated by reference voltage sources 23 and 24 over the entire pulse width $t_x$ and $t'_x$. This requires closer matching of the switches 25 and 26 and results in much greater dependence on the reference voltage sources 23 and 24, because of their being switched during the whole variable pulse widths as opposed to during an error pulse width only.

With the novel pulse width to D.-C. voltage converter, operating accuracy is essentially dependent upon switching operations as opposed to the more common analog operations. Switching can be performed more accurately than any other operation. In the illustrated embodiment all of the functions have been transformed to what are basically switching operations. Also, the converter is a dynamic device which incorporates an operational amplifier as a low impedance output source in an efficient manner. The converter is not dependent upon pulse frequency because each cycle is independent, the feedback and input pulses inherently adjust to different pulse rates.

The operation of the integrator 30 and the error signal source 20 are interrelated so as to determine the converter loop gain:

$$v_o = v_i \frac{1}{RC}$$

The output voltage $v_o$ is determined by the product of the input voltage $v_i$ and the reciprocal of the RC term from the error signal source resistors 31, 32, 41 and 42 and the integrating capacitor 22. It will be noted that because of the feedback arrangement, neither very high gain nor drift stabilization is required.

When the pulse width modulator 40 is adjusted to generate pulse width signals with a proportion different from the inverse of the proportion of the pulse width converter pulse width input to its D.-C. output voltage, the converter operates as a scale changer. When the change in the pulse width to D.-C. proportion is variable, the converter of FIGURE 1 is a divider.

While particular embodiments of the invention have been shown and described herein, it is not intended that the invention be limited to such disclosure, but that changes and modifications can be made and incorporated within the scope of the claims. For example, while the invention has been described as operating with pulse width signals which are D.-C. voltage signals, it is to be understood that other types of signals such as pulse width modulated current signals or pulse width modulated carrier frequency signals can be converted to D.-C. voltage signals in the same manner.

What is claimed is:

1. A pulse width to D.-C. voltage converter comprising:

(a) an output operational amplifier integrator for generating a D.-C. signal;

(b) feedback means responsive to said integrator output signal for producing pulse width modulated feedback signals;

(c) bipolarity switching means, responsive to input pulse width modulated signals applied thereto and said feedback pulse signals, for generating incremental bipolarity error signals coupled to said integrator so as to change said D.-C. output signal in accordance with time duration differences in said pulse width input and feedback signals.

2. A dynamic pulse width to D.-C. voltage converter comprising:

(a) an output operational amplifier integrator for generating a D.-C. signal as a low impedance source;

(b) feedback means responsive to said integrator output signal for producing pulse width modulated feedback signals;

(c) pulse width comparator means, responsive to input and feedback pulse width modulated signals applied thereto, for generating pulse width error signals proportional to the difference;

(d) switching means, responsive to the error signals coupled to said integrator output D.-C. signal in accordance with time differences in said pulse width input and feedback signals.

3. A pulse width to D.-C. converter comprising:

(a) an integrator for producing a D.-C. voltage output signal;

(b) a D.-C. to pulse width modulator responsive to said integrator;

(c) switching means responsive to applied input pulse width modulated signals and the output of said D.-C. to pulse width modulator for applying a net difference signal to said integrator.

4. A pulse width to D.-C. converter and divider comprising:

(a) an integrator for producing a D.-C. voltage output signal;

(b) a variable D.-C. to pulse width modulator responsive to said integrator output signal;

(c) comparator means responsive to applied input pulse width modulated signals and the output of said D.-C. to pulse width modulator for applying the resulting difference signal to said integrator.

5. A dynamic pulse width to D.C. voltage converter having feedback signals comprising:

(a) a pulse width comparator, responsive to applied input pulse width signals and feedback pulse width signals, for producing, on respective plus and minus output lines, pulse width signals equal to the time difference between the input and feedback pulses;

(b) a bipolarity error signal source, having switches responsive to said pulse width comparator pulses, for generating incremental signals by providing closed signal paths;

(c) an integrator, including an operational amplifier and integrating capacitor providing a low impedance source, responsive to said error signal suorce, to incrementally generate the D.-C. voltage output signal;

(d) a feedback D.-C. voltage to pulse width modulator, responsive to said D.-C. output signal, for generating said feedback pulse width signal.

No references cited.

ARTHUR GAUSS, *Primary Examiner.*

S. D. MILLER, *Assistant Examiner.*